United States Patent
Chang et al.

(10) Patent No.: US 10,879,382 B1
(45) Date of Patent: Dec. 29, 2020

(54) ENHANCEMENT MODE SADDLE GATE DEVICE

(71) Applicant: Northrop Grumman Systems Corporation, Falls Church, VA (US)

(72) Inventors: Josephine Chang, Ellicott City, MD (US); Ken Nagamatsu, Ellicott City, MD (US); Robert S. Howell, Silver Spring, MD (US); Sarat Saluru, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/453,349

(22) Filed: Jun. 26, 2019

(51) Int. Cl.
*H01L 29/778* (2006.01)
*H01L 27/088* (2006.01)
(Continued)

(52) U.S. Cl.
CPC .... *H01L 29/7785* (2013.01); *H01L 21/02507* (2013.01); *H01L 21/28264* (2013.01);
(Continued)

(58) Field of Classification Search
CPC ............. H01L 29/4236; H01L 29/7813; H01L 29/7825; H01L 29/42336; H01L 29/42352; H01L 21/02507; H01L 29/66431; H01L 29/66462; H01L 29/778–7789; H01L 2924/13064
See application file for complete search history.

(56) References Cited

U.S. PATENT DOCUMENTS 6,670,652 B2   12/2003  Song
9,035,355 B2    5/2015  Ostermaier et al.
(Continued)

OTHER PUBLICATIONS

Lanford et al., Recessed-gate enhancement-mode GaN HEMT with high threshold voltage, Electronics Letters, vol. 41, No. 7, Mar. 31, 2005, pp. 449-450.

(Continued)

*Primary Examiner* — Selim U Ahmed
*Assistant Examiner* — Evan G Clinton
(74) *Attorney, Agent, or Firm* — Edell, Shapiro & Finnan, LLC

(57) ABSTRACT

An enhancement-mode (e-mode) field effect transistor (FET) comprises a buffer layer, and a superlattice of conducting channels on the buffer layer and including a trench that cuts down through the superlattice into the buffer layer and separates the superlattice into a source-access region and a drain-access region, wherein the buffer layer forms a bottom of the trench. The e-mode FET includes a source and a drain adjacent to the source-access region and the drain-access region, respectively. The e-mode FET further includes a gate in the trench, such that a voltage above a threshold voltage of the e-mode FET applied to the gate induces a current channel in the buffer layer underneath the gate, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

19 Claims, 9 Drawing Sheets

(51) Int. Cl.
    *H01L 29/15*       (2006.01)
    *H01L 29/20*       (2006.01)
    *H01L 29/66*       (2006.01)
    *H01L 29/423*     (2006.01)
    *H01L 21/28*       (2006.01)
    *H01L 21/8252*    (2006.01)
    *H01L 29/205*     (2006.01)
    *H01L 21/02*       (2006.01)

(52) U.S. Cl.
    CPC ...... *H01L 21/8252* (2013.01); *H01L 27/0883* (2013.01); *H01L 29/155* (2013.01); *H01L 29/2003* (2013.01); *H01L 29/205* (2013.01); *H01L 29/4236* (2013.01); *H01L 29/42376* (2013.01); *H01L 29/66462* (2013.01)

(56) References Cited

U.S. PATENT DOCUMENTS

| | | | |
|---|---|---|---|
| 9,202,906 B2 | 12/2015 | Howell et al. | |
| 9,419,120 B2 | 8/2016 | Nechay et al. | |
| 9,647,104 B2 | 5/2017 | Ostermaier et al. | |
| 9,733,897 B2 | 8/2017 | Lee | |
| 9,773,897 B2 | 9/2017 | Nechay | |
| 9,837,520 B2 | 12/2017 | Ostermaier et al. | |
| 9,923,087 B2 | 3/2018 | Dasgupta et al. | |
| 10,084,075 B2 | 9/2018 | Nechay et al. | |
| 10,325,982 B1* | 6/2019 | Chang | H01L 29/7827 |
| 2013/0200387 A1 | 8/2013 | Lee et al. | |
| 2013/0313560 A1* | 11/2013 | Khalil | H01L 29/2003 |
| | | | 257/76 |
| 2016/0104703 A1 | 4/2016 | Parke et al. | |
| 2016/0293596 A1 | 10/2016 | Fareed et al. | |

OTHER PUBLICATIONS

Micovic et al., GaN enhancement/depletion-mode FET logic for mixed signal applications, Electronics Letters, vol. 41, No. 19, Sep. 15, 2005, pp. 1081-1083.

Lu et al., Low leakage normally-off tri-gate GaN MISFET, Proceedings of the 2012 24th International Symposium on Power Semiconductor Devices and ICs, Jun. 3-7, 2012, pp. 33-36.

\* cited by examiner

ENHANCEMENT MODE SADDLE GATE DEVICE

TECHNICAL FIELD

The present disclosure relates generally to transistor devices and more specifically to field effect transistor (FET) devices on superlattice structures.

BACKGROUND

While enhancement mode ("e-mode") Gallium Nitride (GaN) field effect transistors (FETs) and high electron mobility transistors (HEMTs) have been demonstrated, their conventional device structures are not easily integrated into a superlattice castellated FET (SLCFET) process flow. Moreover, methods to dope or modify the surface and/or charge profile of the SLCFET to shift its threshold voltage in a positive direction may not be easily integrated into a standard depletion-mode (d-mode) SLCFET process flow. Thus, constructing an integrated circuit (IC) that combines such conventional e-mode and d-mode devices using a common SLCFET process flow presents substantial technical and cost challenges.

SUMMARY OF THE INVENTION

An enhancement-mode (e-mode) field effect transistor (FET) comprises a buffer layer, and a superlattice of conducting channels on the buffer layer and including a trench that cuts down through the superlattice into the buffer layer and separates the superlattice into a source-access region and a drain-access region of the superlattice, wherein the buffer layer forms a bottom of the trench. The e-mode FET includes a source and a drain adjacent to the source-access region and the drain-access region, respectively, so that the source and the drain are each spaced-apart from the trench. The e-mode FET further includes a gate disposed in the trench and configured such that (i) a voltage applied to the gate above a threshold voltage of the e-mode FET induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

An example embodiment of the invention is described below with reference to the following drawing figures, in which like reference numerals in the various figures are utilized to designate like components.

DESCRIPTION OF EXAMPLE EMBODIMENTS

Embodiments presented herein are directed to a structure and a method of making an enhancement mode (e-mode) saddle gate field effect transistor (FET) (more generally referred to as an "e-mode FET") constructed on a base structure and a superlattice of conducting layers. Other embodiments include a structure and a method of making an integrated circuit (IC) including both the e-mode FET and a depletion mode (d-mode) FET, such as a superlattice castellated FET (SLCFET), constructed on a common base structure and superlattice.

Figure 1:
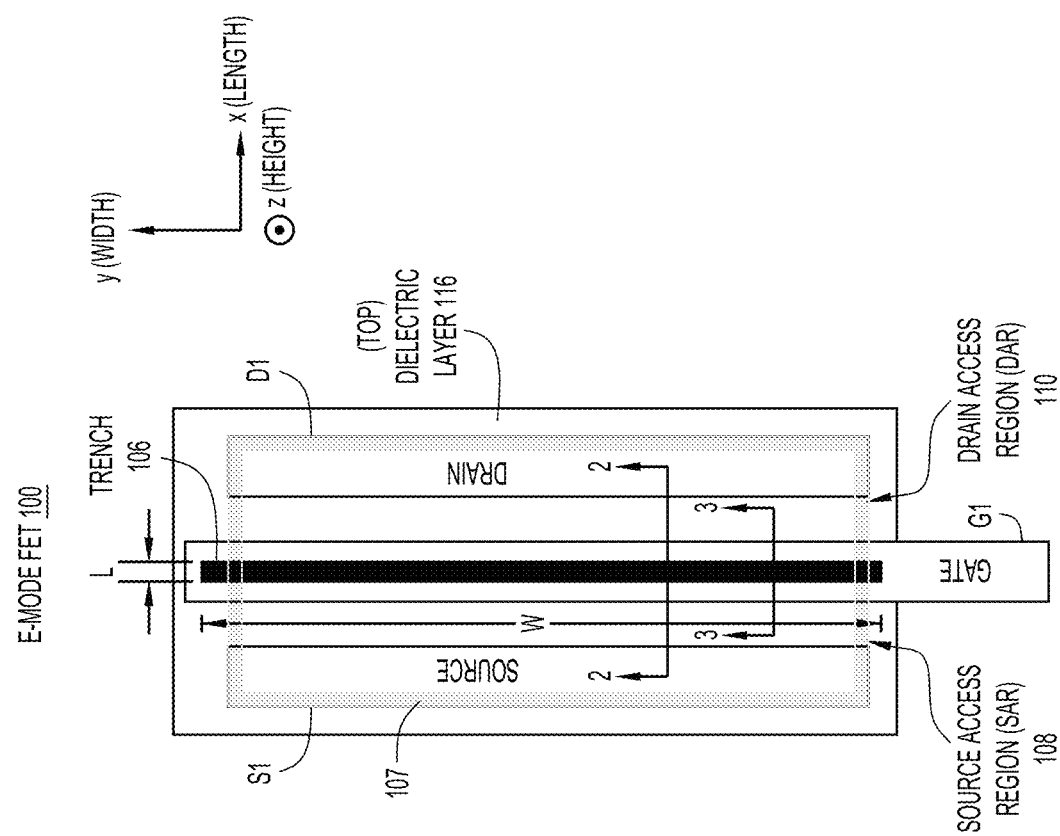
FIG. 1 is a top plan view of an example enhancement mode ("e-mode") saddle-gate field effect transistor (FET) (referred to herein as an "e-mode FET") constructed on a superlattice structure.
Figure 2:
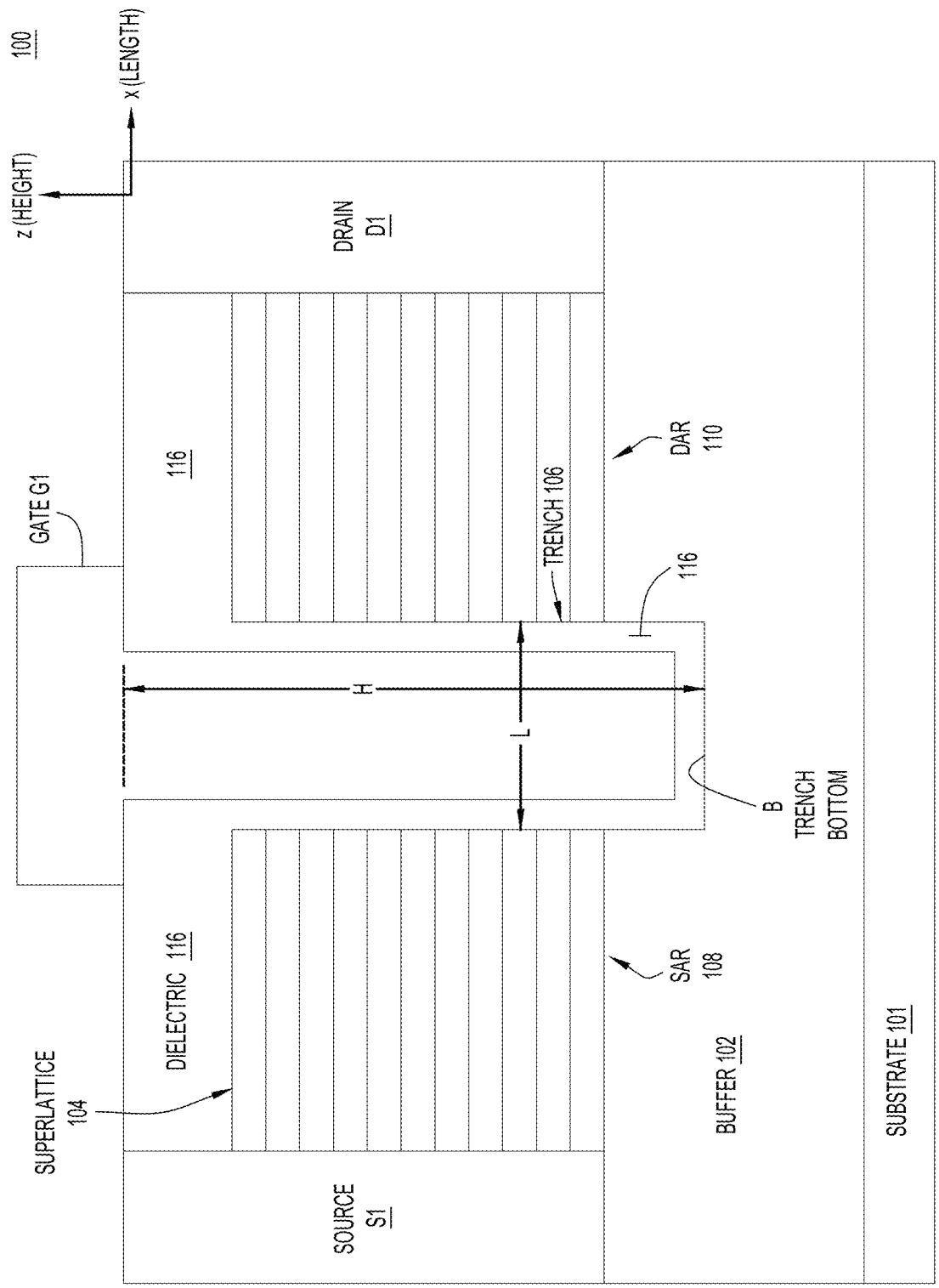
FIG. 2 is a cross-sectional view of the example e-mode FET taken along the line 2-2 in FIG. 1.
Figure 3:
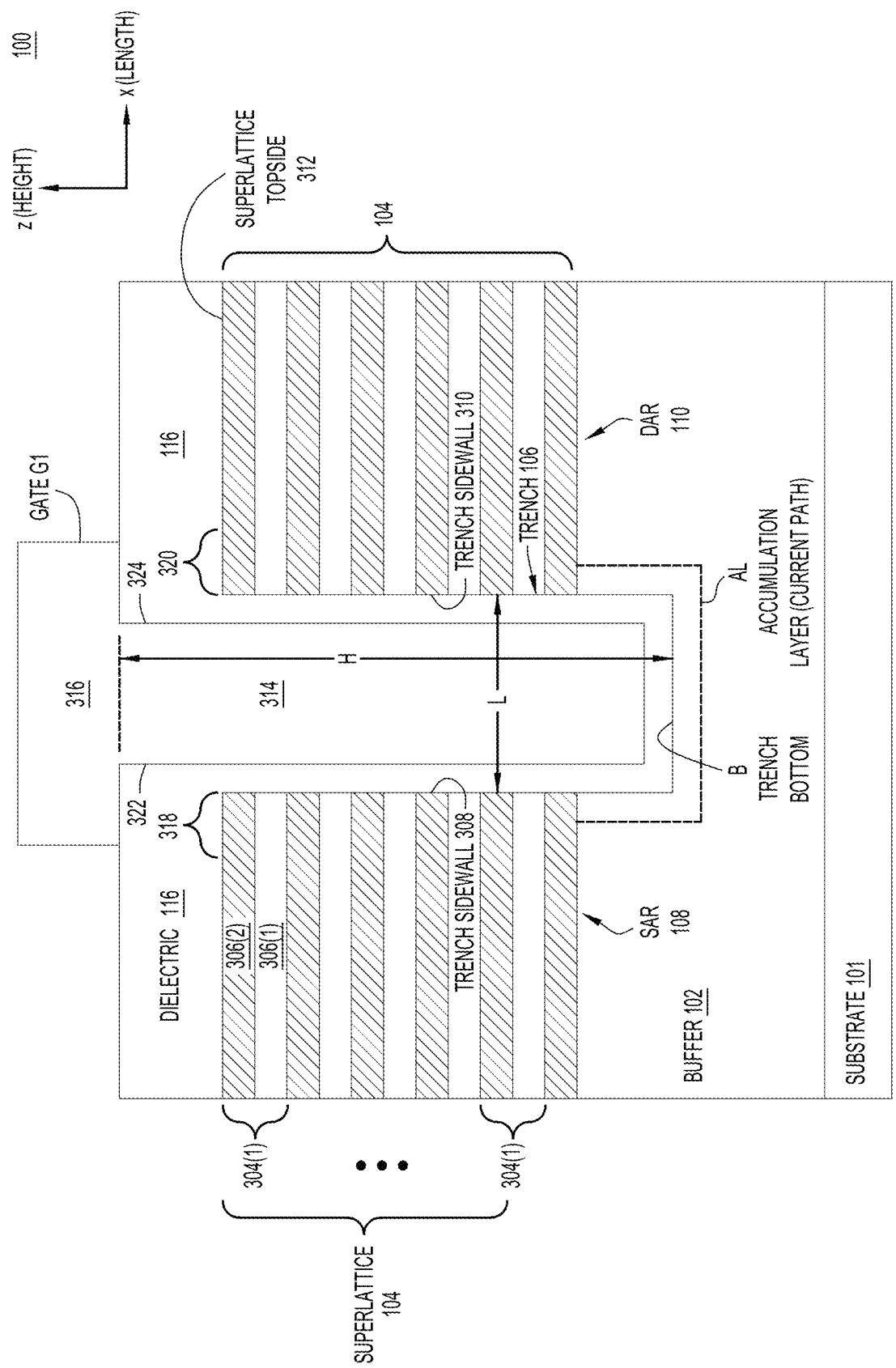
FIG. 3 is a cross-sectional view of the example e-mode FET taken along the line 3-3 of FIG. 1.

Reference is now made to FIGS. 1-3. FIG. 1 is a top plan view of an example e-mode FET 100 constructed on a superlattice structure. FIGS. 2 and 3 are cross-sectional views of e-mode FET 100 taken along the lines 2-2 and 3-3 in FIG. 1. As best shown in FIGS. 2 and 3, e-mode FET 100 includes a substrate layer 101 (e.g., Aluminum Gallium Nitride (AlGaN)), an insulating buffer layer 102 on the substrate layer, and a superlattice of parallel conducting layers 104 (also referred to simply as superlattice 104) on the buffer layer. Buffer layer 102 is an insulating layer configured to enable high quality epitaxy. Buffer layer 102 may be a semiconductor, but need not be a semiconductor. Un-doped GaN is a good choice for buffer layer 102 because it is lattice matched to GaN; however, a small amount of doping may be introduced into the GaN (in which case buffer layer 102 is only lightly doped), such as Aluminum (Al), Iron (Fe), or Carbon (C) to make the buffer layer more insulating. The term "on" used herein with respect to a first layer being "on" a second layer means that the first layer is adjacent to, on top of, overlying, or covering the second layer, and may be either in direct contact, or not in direct contact, with the second layer (i.e. there may be one or more intervening layers between the first and the second layers). In the embodiment of FIGS. 1-3, substrate layer 101, buffer layer 102, and superlattice 104 are stacked one on top of the other in a vertical direction, and each layer is in contact with the underlying layer.

FET 100 also includes a gate trench 106 that cuts down vertically completely through superlattice 104 and into buffer layer 102, such that the buffer layer forms a bottom B of the trench. Trench 106 has a width W that defines an active width of FET 100, a height H, and a length L that defines a gate length of the FET, which is less than the width W in the example of FIG. 1. Length L, Width W, and height H extend in x (length), y (width), and z (height/vertical) directions, respectively, that are transverse/orthogonal to each other. The cross section of trench 106 may be substantially rectangular, rounded, or shaped in accordance with other cross section shapes. Trench 106 completely separates or divides superlattice 104 across length L of the trench, and along width W of the trench, into a source-access region (SAR) 108 on a left-side of the trench and a drain-access region (DAR) 110 on a right-side of the trench, as shown in FIGS. 1 and 2. In an example, trench 106 has a length of 10-500 nm and a width of 1-500 um, buffer layer 102 has a depth of 50-100 nm, the trench cuts down a depth 50-200 nm into the buffer layer, and 1-10 repetitions of this structure are electrically tied together to form a multi-finger FET. Also depicted in FIG. 1 is a boundary-line that defines an isolation region rectangle 107. The region outside of/surrounding isolation region rectangle 107 (but not inside of the rectangle) is an isolation region that is implanted to be isolating. An active width of FET 100 is determined by the isolation region, which is smaller than width W of trench 106.

FET 100 also includes gate contact G1 (also referred to as gate G1) that fills width W of trench 106 along length L of the trench, source contact S1 (also referred to as source S1) embedded in/adjacent to source-access region 108 and spaced-apart from the trench, and drain contact D1 (also referred to as drain D1) embedded in/adjacent to drain-access region 110 and spaced-apart from the trench. Gate G1 and trench 106 extends past an active region of superlattice 104. Thus, source S1 and drain D1 are positioned so that the source and the drain are spaced-apart from each other in the length direction, i.e., on opposing sides of the gate G1, and so that the source and the drain contact the parallel conducting layers of the superlattice, described below. FET 100 also includes a dielectric layer 116 (e.g., Silicon Nitride $Si_3N_4$) on superlattice 104 that covers source-access region 108 between source S1 and trench 106, covers drain-access region 110 between drain D1 and the trench, and covers/lines the trench to form a dielectric layer between the trench and gate G1.

As best shown in FIG. 3, superlattice 104 includes multiple parallel heterostructures 304(1)-304(5) (collectively referred to as "heterostructures 304") overlying one another over along a height of the superlattice to form a vertical stack of horizontal (parallel) heterostructures on buffer layer 102. Each heterostructure forms a corresponding one of parallel conducting layers or sheets of superlattice 104. Each heterostructure 304(i) respectively includes a first layer 306(1) and a second layer 306(2) overlying the first layer so as to form a respective one of the conducting layers of the superlattice at an interface between the two layers. While a stack of 5 heterostructures are shown, it is understood that a stack of more or fewer heterostructures (and resulting superlattice layers) may be used.

In an example, first layer 306(1) of each heterostructure 304(i) comprises GaN, and second layer 306(2) of each heterostructure 304(i) comprises AlGaN; however, a variety of heterostructures may be employed as long as each heterostructure comprises two layers of dissimilar materials configured to create a sheet of electrons (i.e. a Two-Dimensional Electron Gas ("2DEG") layer) or a sheet of holes (i.e., a Two-Dimensional Hole Gas ("2DHG") layer 2DHG) at the interface between the two dissimilar materials. Various additional heterostructure materials include, but are not limited to, Aluminum Gallium Arsenide (AlGaAs) and Gallium Arsenide (GaAs), Indium Aluminum Nitride (InAlN) and GaN, and alloys of Silicon (Si) and Germanium (Ge) overlying a base structure.

Still referring primarily to FIG. 3, substantially vertical edges of source-access region 108 and drain-access region 110 form substantially vertical source-side and drain-side edges or sidewalls 308 and 310 of trench 106 (i.e., source-side and drain-side trench sidewalls 308 and 310), respectively, spaced-apart by length L. Trench sidewalls 308 and 310 rise vertically from trench bottom B and past a topside 312 of superlattice 104. Gate G1 includes a gate post 314 and a gate top 316 connected to the post and that together form a T-gate. Gate post 314 is shaped and sized so that the post has a gate length that completely fills trench 106 (as covered by dielectric layer 116), and so that the post covers trench bottom B and trench sidewalls 308 and 310. Gate top 316 spills over opposing source-side and drain-side peripheries 318, 320 of superlattice topside 312, adjacent trench sidewalls 308, 310, respectively. Gate post 314 has substantially vertical opposing source-side and drain-side gate sidewalls 322, 324 adjacent substantially vertical source-side and drain-side trench sidewalls 308, 310, respectively. That is, trench sidewalls 308, 310 and gate sidewalls 322, 324 are parallel to each other as they rise through superlattice 104. Thus, a respective separation between each trench sidewall 308, 310 and each gate sidewall 322, 324, respectively, which is equal to a thickness/length of intervening dielectric layer 116, is substantially constant as the trench sidewalls rise from trench bottom B to and past superlattice topside 312.

Operation of FET 100 is now described. Trench 106 physically severs the conducting layers of superlattice 104 in source-access region 108 from those in drain-access region 110. When a voltage (i.e., a "gate voltage") less than a threshold voltage of FET 100 is applied to gate G1, no current can flow from source S1 to drain D1 through superlattice 104 because source S1 is cut-off from drain D1, and there is no path for current to flow from the source to the drain. Thus, a sub-threshold voltage applied to gate G1 turns off FET 100.

In contrast, when a voltage greater than (i.e. above) a threshold voltage of FET 100 is applied to gate G1, where the threshold voltage may be zero or positive, for example, band bending in buffer layer 102 below superlattice 104 results in an accumulation of a channel of electrons AL (also referred to as a "charge accumulation layer" and a "current channel") at an interface of the buffer layer just below and near gate G1. The shape of current channel AL is similar to that of a saddle beneath gate G1, hence the name "saddle" to identify FET 100 as an "e-mode saddle gate FET 100." Thus, the voltage above the threshold voltage applied to the gate induces current channel AL in buffer layer 102 just underneath trench bottom B and near gate 214. Current channel AL electrically connects source-access region 108 to drain-access region 110, and provides a current path through which current flows from the source-access region (and source S1) to the drain-access region (and drain D1), to turn on FET 100. In other words, current flows from source S1 to drain D1 through (i) source-access region 108 (i.e., the conducting layers of superlattice 104 in the source-access region), (ii) current channel AL, and (iii) drain-access region 110 (i.e., conducting layers of the superlattice in the drain-access region). Current channel AL represents an active channel that switches off when the gate voltage is biased below (i.e., to be less than) the threshold voltage to electrically disconnect source S1 from drain D1, and switches on when the gate voltage is above the threshold voltage to electrically connect the source to the drain. When the voltage applied to gate G1 is equal to the threshold voltage, FET 100 is in transition between conducting and not conducting as described above. The conducting layers of superlattice 104 are part of the source and drain access regions, not the active channel.

The gate-trench sidewall arrangement of the embodiment shown in FIGS. 2 and 3 can result in a relatively high gate-to-source and gate-to-drain capacitances. Described below is an e-mode FET according to an alternative embodiment configured to reduce the gate-to-source and the gate-to-drain capacitances relative to the embodiment shown in FIGS. 2 and 3, described above.

Figure 4:
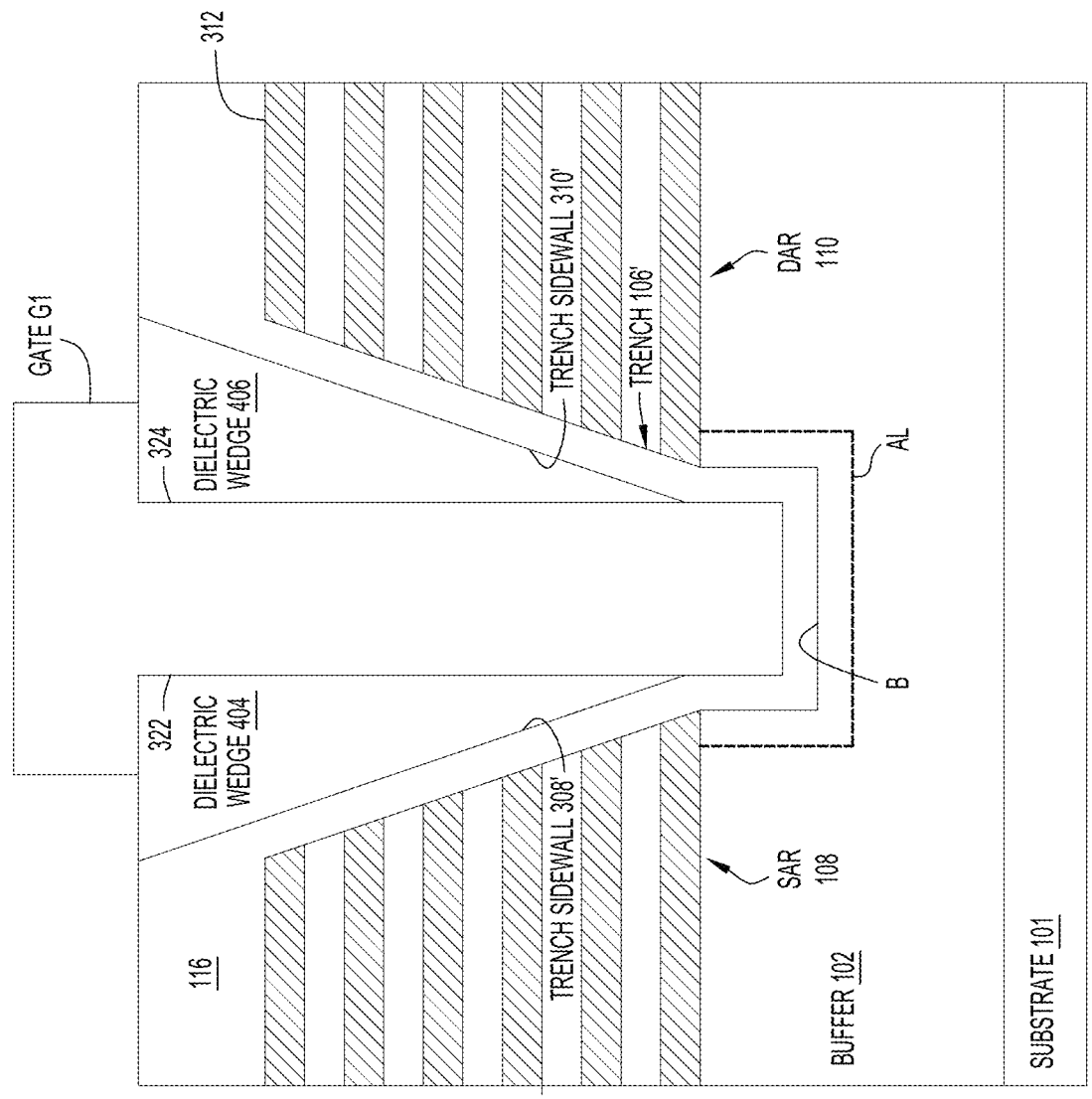
FIG. 4 is a cross-sectional view of the example e-mode FET taken along the line 3-3 of FIG. 1, when the e-mode FET is configured according to an alternative embodiment that employs tapered trench sidewalls.

With reference to FIG. 4, there is a cross section view taken along the cut line 3-3 of the e-mode FET of the alternative embodiment. The alternative embodiment of the e-mode FET is similar to the embodiment shown in FIGS. 2 and 3, except for the differences described below. In the embodiment of FIG. 4, trench 106' includes source-side and drain-side trench sidewalls 308' and 310' (i.e., the edges of source-access and drain-access regions 108 and 110, respectively) that are not vertical. Instead, trench sidewalls 308' and 310' are tapered away from vertical sidewalls 322 and 324 of gate G1, respectively, as the trench sidewalls rise from trench bottom B to superlattice topside 312. Thus, a separation between each gate sidewall 322, 324 and the respective adjacent trench sidewall 308', 310' increases as the respective adjacent trench sidewall rises. The tapered trench sidewalls decreases gate-to-source and gate-to-drain capacitances relative to an arrangement that does not include the tapered trench sidewalls, e.g., the vertical trench sidewalls shown in the embodiment of FIGS. 2 and 3. The alternative embodiment also includes a source-side dielectric wedge 404 wedged between trench sidewall 308' and gate sidewall 322, and a drain-side dielectric wedge 406 wedged between trench sidewall 310' and gate sidewall 324. Wedges 404, and 406 follow the tapers of trench walls 308' and 310'.

Having described single e-mode FET 100 above, an integrated circuit (IC) that includes the e-mode FET alongside a different type of FET is now described. An IC typically includes multiple FETs of different types that interact to perform specialized circuit functions. The FETs may include one or more e-mode FETs and one or more d-mode FETs to implement "E-D logic." Accordingly, an embodiment presented herein is directed to an IC that includes an e-mode FET and a d-mode FET constructed on a common structure that includes a superlattice, as described below in connection with FIGS. 5 and 6. The d-mode FET may be configured as a SLCFET. The d-mode and e-mode FETs may be fabricated simultaneously using substantially identical process flows. The d-mode and e-mode FETs may be interconnected with metal wiring or they may share one or more source and/or drain contact regions. By way of overview, the SLCFET includes a superlattice (2DEG) on a buffer layer (e.g., an un-doped or lightly doped GaN buffer layer). The superlattice has many parallel castellation trenches formed in the superlattice, which completely cut through the superlattice and into (e.g., 50-100 nm into) the buffer layer, leaving ridges on either sides of each trench. A gate covers the trenches and the ridges. The castellation trenches and ridges are parallel to a direction of current flow from a source to a drain of the SLCFET. When a negative bias is applied to the gate, a side-pinching action depletes carriers from the superlattice remaining in the ridges to turn off current flow between the source and the drain. A particular SLCFET structure is described below.

Figure 5:
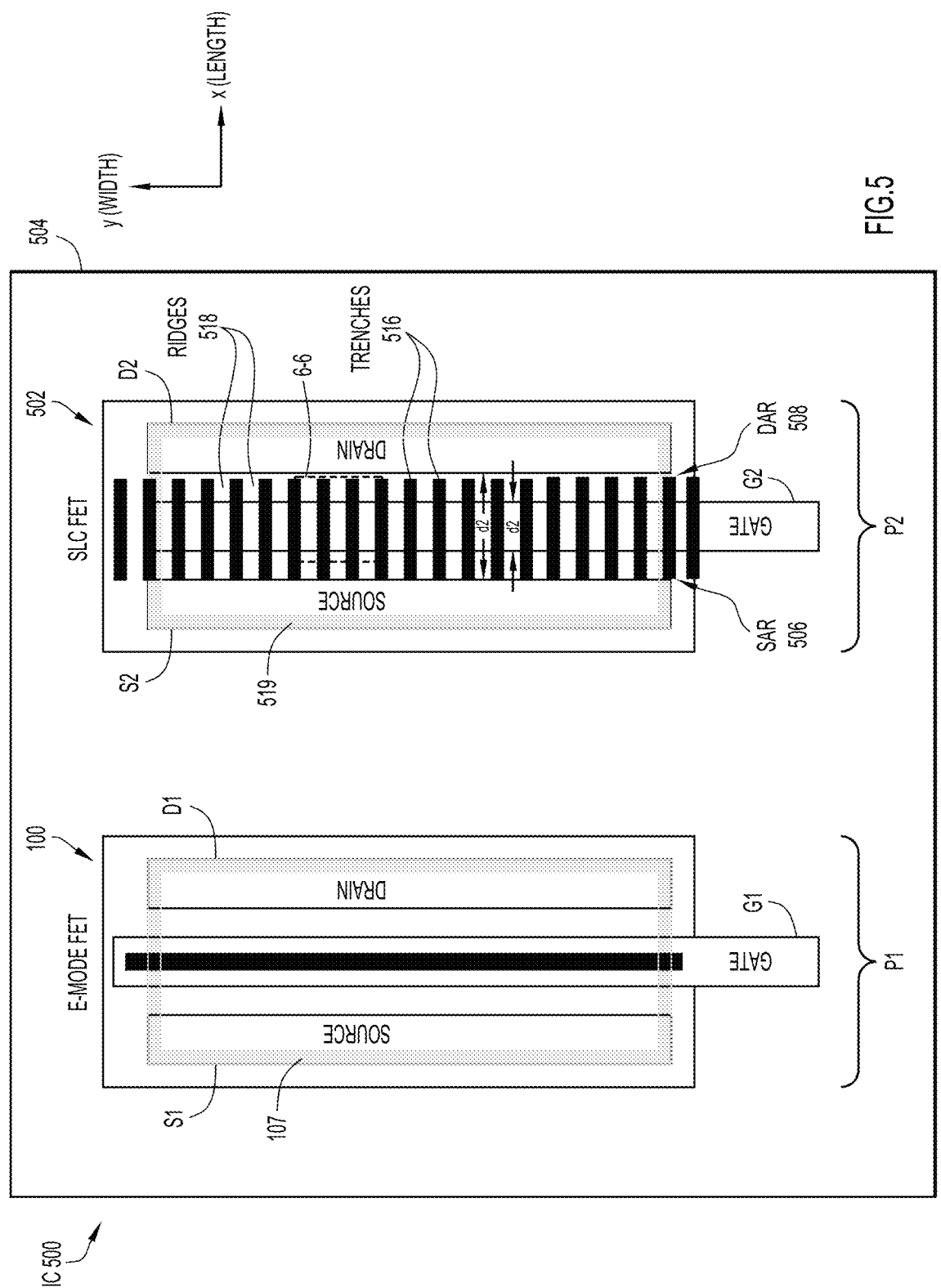
FIG. 5 is an illustration of the example integrated circuit including the example e-mode FET and an example superlattice castellated field effect transistor (SLCFET) constructed on adjacent portions of a superlattice-based common structure.
Figure 6:
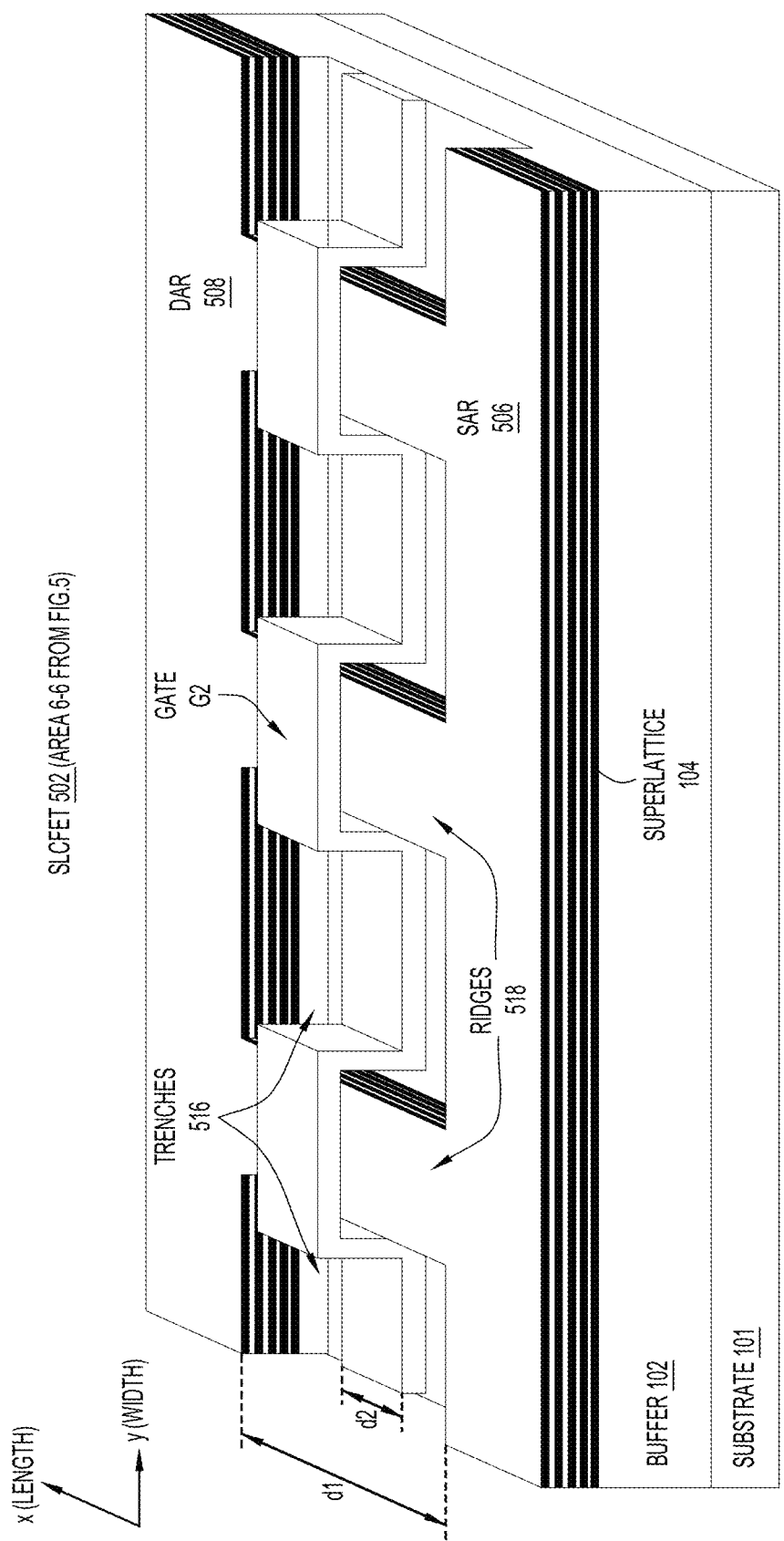
FIG. 6 is a perspective of view of the example SLCFET in an area 6-6 of FIG. 5.

With reference to FIG. 5, there is an illustration of top plan view of a portion of an example IC 500 that includes e-mode FET 100 and a SLCFET 502 constructed on adjacent respective portions P1 and P2 of a superlattice-based common structure 504 of the IC, including substrate layer 101, buffer layer 102, and superlattice 104. An advantage associated with IC 50 is that both e-mode FET 100 and SLCFET 502 may be constructed on common structure 504 in a single SLCFET process flow. FIG. 6 is a perspective view of SLCFET 502 in an area 6-6 of the SLCFET from FIG. 5. With reference to both FIGS. 5 and 6, SLCFET 502 includes portions of substrate layer 101, buffer layer 102, and superlattice 104 adjacent to corresponding portions of those same layers of e-mode FET 100. SLCFET 502 also includes a source-access region 506 of superlattice 104 (in portion P1 of the superlattice), a drain-access region 508 of the superlattice (in portion P2) spaced-apart from the source-access region by a distance d1 in the x-direction (i.e., length direction), a source S2 embedded in and in contact with the source-access region, and a drain D2 embedded in and in contact with the drain-access region.

SLCFET 502 also includes alternating ridges 518 and trenches 516 formed in superlattice 104 and referred to as ridge and source "castellations," and that extend parallel to each other from source-access region 506 to drain-access region 508 over distance d1 along the x-direction (i.e., along the length direction). Alternating ridges 518 and trenches 516 undulate in the y-direction across a width of SLCFET 502 that is transverse to the length, such that the alternating ridges and trenches define a castellated region of length d1 from source-access region 506 to drain-access region 508 throughout the length of the SLCFET. Each of ridges 514 provides a respective layered stack of 2DEG channels that connects source-access region 508 to drain-access region 510 (and thus source S2 to drain D2). Thus, each ridge may be referred to as a "multichannel" ridge. Also depicted in FIG. 5 is a boundary-line that defines an isolation region rectangle 519 for SLCFET 502. The region outside of isolation region rectangle 519 (but not inside of the rectangle) is an isolation region that is implanted to be isolating. An active width of SLCFET 502 is determined by the isolation region.

SLCFET 502 includes a gate G2 that covers, and undulates with, ridges 518 and trenches 516 along the width of the SLCFET. Gate G2 has a length d2 in the x-direction that is less than the length d1. Thus, gate G2 represents an undulating strip of metallization of length d2 in the x-direction, positioned between and spaced-apart from the source-access region 508 and the drain-access region 510 in the length direction, which spans and undulates along the width of the SLCFET in the y-direction. A negative voltage applied to gate G2 selectively turns off (i.e., depletes) the 2DEG channels to correspondingly turn off the SLCFET.

Methods of FET fabrication are now described. An example fabrication of e-mode FET 100 is described below in connection with FIGS. 7-10.

Figure 7:
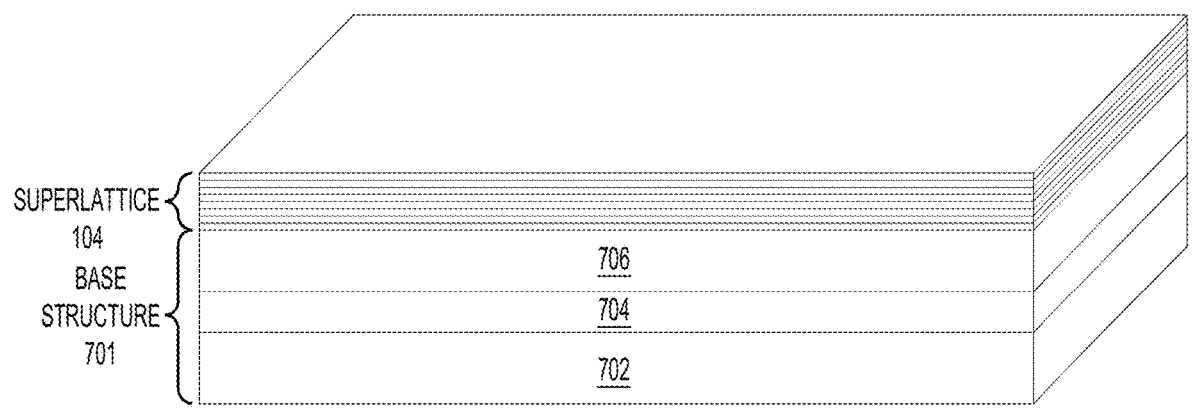
FIG. 7 is a perspective view illustrating an example epitaxial structure formed in initial stages of fabricating the example e-mode FET.

FIG. 7 is an illustration of an epitaxial structure formed in initial stages of the fabrication. The epitaxial structure includes superlattice 104 and a base structure 701. Base structure 701 may comprise a base layer 702, a nucleation layer 704 overlying the base layer (where the base layer and the nucleation layer may collectively form substrate layer 101), and a buffer layer 706 (e.g., buffer layer 102), overlying the nucleation layer, of, for example, Silicon Carbide (SiC) or $Si_3N_4$, AlGaN, and un-doped (or lightly doped) GaN, respectively. Other base structures will be apparent to those skilled in the art.

The epitaxial structure also includes heterostructure layers of superlattice 104 formed (e.g., deposited) on base structure 701 using successive applications of an epitaxial growth process. The growth process may include Metal Organic Chemical Vapor Deposition (MOCVD) or Molecular Beam Epitaxy (MBE), for example.

Figure 8:
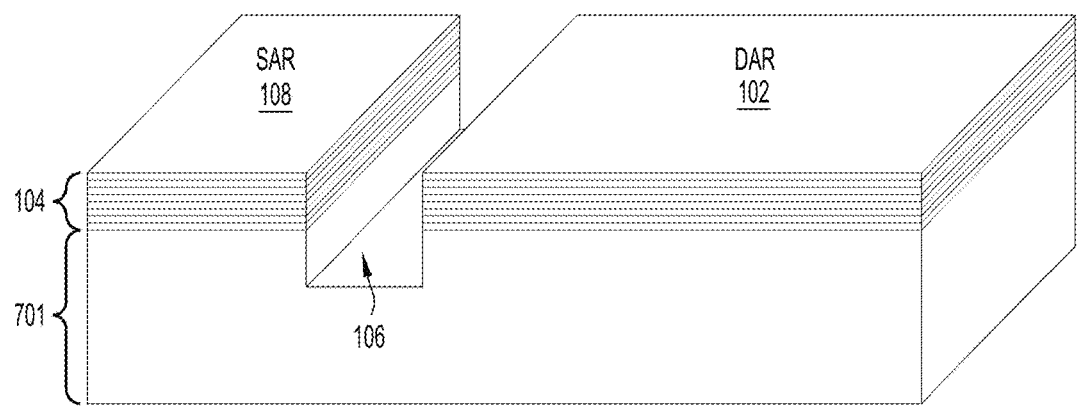
FIG. 8 is a perspective view illustrating the example epitaxial structure of FIG. 7 after a trench has been formed in the epitaxial structure.

FIG. 8 is an illustration of the epitaxial structure of FIG. 7 after trench 106 has been formed in the epitaxial structure. The afore-mentioned structures may be etched into the superlattice using Reactive Ion Etching (ME), for example.

Figure 9:
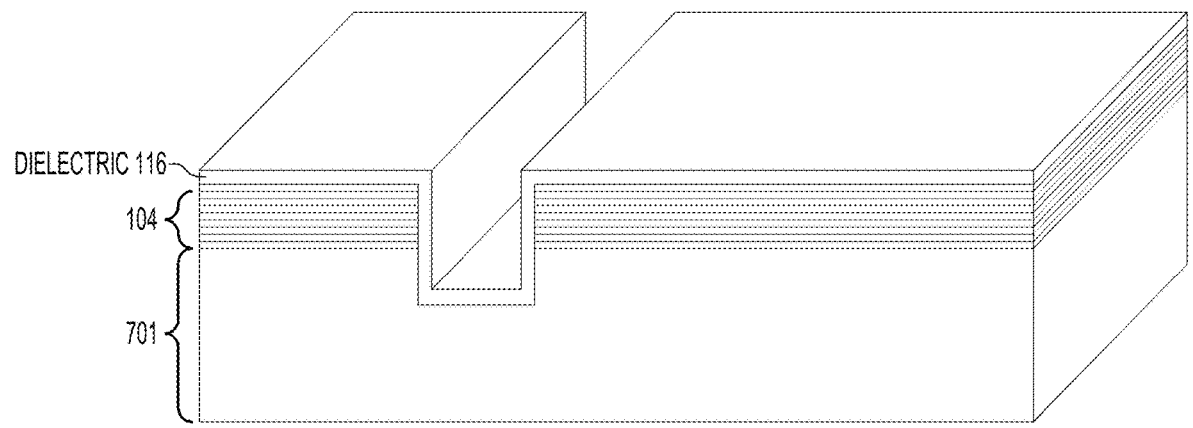
FIG. 9 is a perspective view illustrating the example epitaxial structure of FIG. 8 after a conformal dielectric has been formed on the epitaxial structure.

FIG. 9 is an illustration of the epitaxial structure of FIG. 8 after dielectric layer 116 has been formed on a top surface of the epitaxial structure. Dielectric layer 116 may be deposited using low-pressure chemical vapor deposition (LPCVD), or plasma-enhanced chemical vapor deposition (PECVD), for example.

Figure 10:
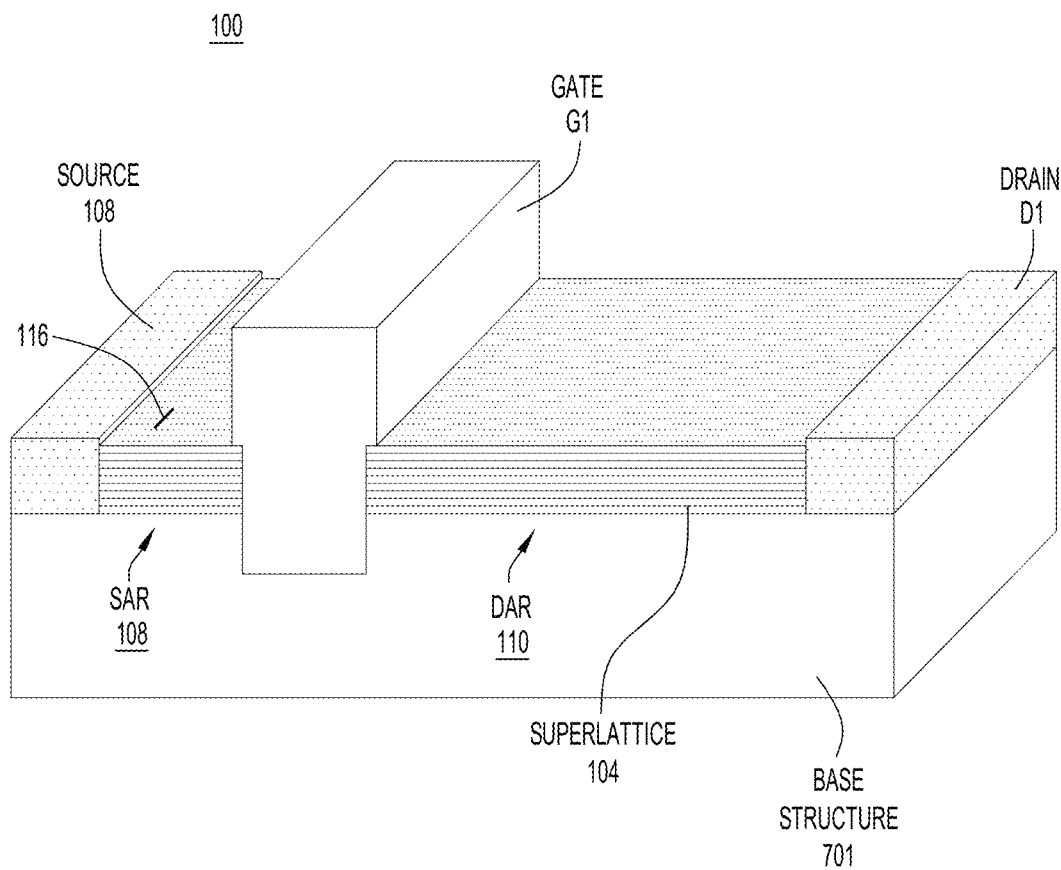
FIG. 10 is a perspective view illustrating the example epitaxial structure of FIG. 7 after electrically conductive gate, source, and drain contacts have been formed on the epitaxial structure.

FIG. 10 is an illustration of the epitaxial structure of FIG. 9 after gate G1 has been formed on the epitaxial structure. Gate G1 may be formed, e.g., using electron beam lithography, metal deposition by reactive direct current (DC) or radio frequency (RF) sputtering, thermal evaporation, and liftoff. In the example shown in FIG. 8, gate G1 forms gate post 314 that fills trench 106, and includes gate top 316 connected to the gate post. Similar techniques may be used to form source S1 and drain D1 on the epitaxial structure.

Figure 11:
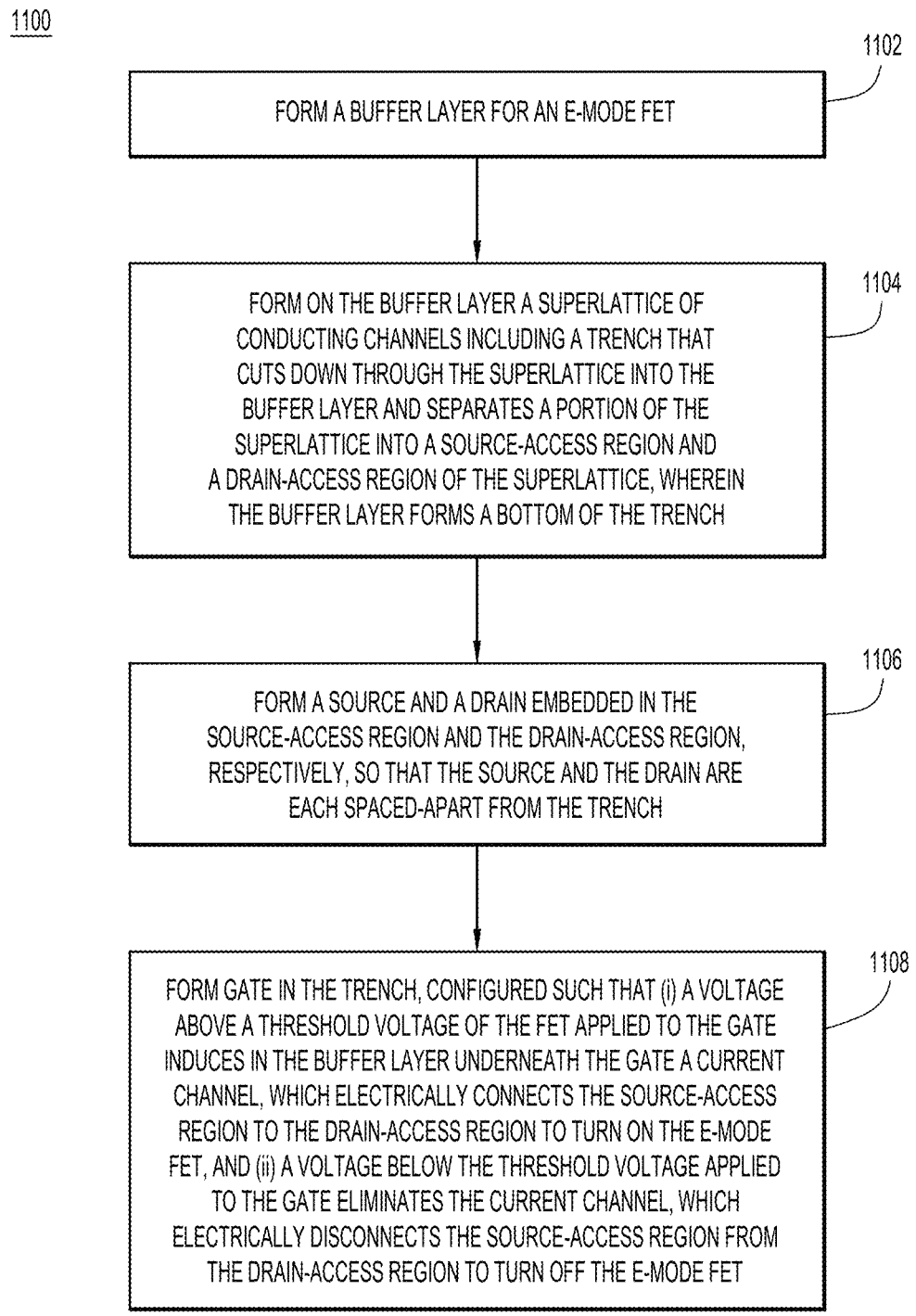
FIG. 11 is a flowchart of an example method of making the example e-mode FET.

FIG. 11 is a flowchart of an example method of making/forming an e-mode FET (e.g., e-mode FET 100).

Operation 1102 includes forming a base structure including a buffer layer that is un-doped or only lightly doped as described above.

Operation 1104 includes forming on the buffer layer a superlattice of conducting channels including a trench that cuts down through the superlattice into the buffer layer and separates a portion of the superlattice into a source-access region and a drain-access region of the superlattice, wherein the buffer layer forms a bottom of the trench. The superlattice of conducting channels may be formed on the buffer layer using successive applications of an epitaxial growth process. The growth process may include MOCVD or MBE, for example. The trench may be etched into the superlattice using ME, for example. Operation 1104 further includes forming a dielectric layer on the superlattice of conducting channels and the trench. The conformal dielectric layer may be deposited using LPCVD or PECVD, for example.

Operation 1106 includes forming a source and a drain embedded in the source-access region and the drain-access region, respectively, so that the source and the drain are each spaced-apart from the trench. The source and the drain may be formed on the underlying dielectric and superlattice layers using electron beam lithography, metal deposition by reactive direct current (DC) or RF sputtering, thermal evaporation, and liftoff, for example.

Operation 1108 includes forming a gate in the trench, wherein (i) when a voltage above a threshold voltage of the FET is applied to the gate, a current channel is induced in the buffer layer, underneath the gate, which electrically connects the source-access region to the drain-access region to turn on the e-mode FET, and (ii) when a voltage below the threshold voltage is applied to the gate, the current channel is eliminated, which electrically disconnects the source-access region from the drain-access region to turn off the e-mode FET. The gate may be formed using the same techniques used to form the source and the drain, for example.

A method of making a SLCFET (e.g., SLCFET 502) is similar to the method of making the e-mode FET. For example, the method includes forming a substrate including a buffer layer (which may be the same buffer layer on which the e-mode FET is constructed), and then forming a superlattice of conducting channels on the buffer layer, such that the superlattice includes spaced-apart source and drain access regions, and alternating (castellated) ridges and trenches in parallel with each other extending between the source and drain access regions. The method includes forming source and drain metal on the source and drain access regions, and forming a castellated strip of gate metal across the castellated ridges and trenches. Moreover, the method of forming the e-mode FET and the method of forming the SLCFET may be combined into a SLCFET process flow for forming an integrated circuit that includes the e-mode FET and the SLCFET on separated portions of the same buffer layer and superlattice.

E-mode and d-mode combined logic (i.e., E-D logic) requires a technology with both enhancement and depletion mode device types available. The addition of even a simple superlattice-based e-mode device (e.g., FET) along-side a superlattice-based d-mode device (e.g., FET) is transformative because it enables simple E-D digital logic for applications such as, but not limited to, control signal routing. The saddle-gate e-mode FET with superlattice access regions presented herein is an e-mode FET that is easily integrated into a standard SLCFET process flow, enabling superlattice-based E-D logic. For example, when integrating monolithic microwave ICs (MMICs) into a package, the number of inputs/outputs needed can be an important factor in determining the complexity and cost of the final package. The number of direct current (DC) control signals required for a SLCFET in the package can be reduced by 50% or more if a simple on-chip digital inverter were available to generate complementary gate bias signals. An IC that combines the e-mode FET presented herein (e.g., to implement the on-chip digital inverter) in combination with SLCFET(s) on a common substrate/superlattice provides a cost effective and simplified solution for IC integration.

In summary, in one aspect, an e-mode FET is provided comprising: a buffer layer; a superlattice of conducting channels on the buffer layer and including a trench that cuts down through the superlattice into the buffer layer and separates the superlattice into a source-access region and a drain-access region of the superlattice, wherein the buffer layer forms a bottom of the trench; a source and a drain adjacent to the source-access region and the drain-access region, respectively, so that the source and the drain are each spaced-apart from the trench; and a gate disposed in the trench and configured such that (i) a voltage above a threshold voltage of the e-mode FET applied to the gate induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

In an embodiment, the e-mode FET is constructed on a first portion of the superlattice of conducting channels that is adjacent to a second portion of the superlattice of conducting channels on which a depletion-mode (d-mode) FET is constructed.

In another embodiment, the superlattice comprises heterostructures that form the conducting channels.

In yet another embodiment, each heterostructure includes an Aluminum (Al) Gallium (Ga) Nitride (N) layer and a GaN layer.

In another aspect, a method of making an e-mode FET is provided comprising: forming a buffer layer; forming on the buffer layer a superlattice of conducting channels including a trench that cuts down through the superlattice into the buffer layer and separates the superlattice into a source-access region and a drain-access region of the superlattice, wherein the buffer layer forms a bottom of the trench; forming a source and a drain adjacent to the source-access region and the drain-access region, respectively, so that the source and the drain are each spaced-apart from the trench; and forming a gate in the trench, the gate configured such that (i) a voltage above a threshold voltage of the e-mode FET applied to the gate induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

In yet another aspect, an integrated circuit is provided comprising: a buffer layer; a superlattice of conducting channels on the buffer layer; an e-mode field effect transistor (FET) constructed on a first portion of the superlattice; and a superlattice castellated FET (SLCFET) constructed on a second portion of the superlattice spaced-apart from the first portion of the superlattice; wherein, the e-mode FET includes: in the first portion of the superlattice, a trench that cuts down through the first portion of the superlattice into the buffer layer and that separates the first portion of the superlattice into a source-access region and a drain-access region of the first portion of the superlattice, wherein the buffer layer forms a bottom of the trench; a source and a drain adjacent to the source-access region and the drain-access region; and a gate disposed in the trench and configured such that (i) a voltage above a threshold voltage of the e-mode FET applied to the gate induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

The above description is intended by way of example only. The description is not intended to be exhaustive nor is the invention intended to be limited to the disclosed example embodiment(s). Many modifications and variations will be apparent to those of ordinary skill in the art without departing from the scope and spirit of the invention.

What is claimed is:

1. An enhancement-mode (e-mode) field effect transistor (FET), comprising:
    a buffer layer;
    a superlattice of conducting channels on the buffer layer and including a trench that cuts down through the superlattice into the buffer layer and separates the superlattice into a source-access region and a drain-access region of the superlattice, wherein the buffer layer forms a bottom of the trench, wherein the superlattice does not include any ridges formed in the superlattice and does not include any trenches formed in the superlattice other than the trench;
    a source and a drain adjacent to the source-access region and the drain-access region, respectively, so that the source and the drain are each spaced-apart from the trench; and
    a gate disposed in the trench and configured such that (i) a voltage above a threshold voltage of the e-mode FET applied to the gate induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

2. The e-mode FET of claim 1, wherein the buffer layer is an un-doped buffer layer.

3. The e-mode FET of claim 1, wherein the trench has a length that separates the source-access region from the drain-access region along a length of the trench that is orthogonal to a width of the trench.

4. The e-mode FET of claim 3, wherein the source and the drain are spaced-apart from each other and the trench in a direction of the length.

5. The e-mode FET of claim 3, wherein:
    an edge of the source-access region and an edge of the drain-access region that are spaced-apart from each other across the length of the trench form a source-side trench sidewall and a drain-side trench sidewall that rise from the bottom of the trench to a topside of the superlattice, respectively; and
    the gate fills the trench such that the gate has a source-side gate sidewall and a drain-side gate sidewall adjacent to the source-side trench sidewall and the drain-side trench sidewall, respectively, and a gate bottom adjacent the bottom of the trench, respectively.

6. The e-mode FET of claim 5, wherein:
    the gate is formed as a T-gate that fills the trench completely and covers a periphery of the edge of the source-access region and a periphery of the edge of the drain-access region on the topside of the superlattice.

7. The e-mode FET of claim 5, wherein:
    the source-side trench sidewall and the drain-side trench sidewall are parallel to the source-side gate sidewall and the drain-side gate sidewall, respectively, as the trench sidewalls and the gate sidewalls rise from the bottom of the trench to the topside of the superlattice.

8. The e-mode FET of claim 7, wherein:
    the gate sidewalls rise in a direction that is vertical with respect to a direction of the width and a direction of the length.

9. The e-mode FET of claim 5, wherein:
    the source-side trench sidewall and the drain-side trench sidewall taper away from the source-side gate sidewall and the drain-side gate sidewall as the source-side trench sidewall and the drain-side trench sidewall rise from the bottom of the trench to the topside of the superlattice, respectively.

10. The e-mode FET of claim 5, further comprising a dielectric layer between the gate sidewalls and respective ones of the trench sidewalls, and between the gate bottom and the bottom of the trench.

11. The e-mode FET of claim 1, wherein:
    the gate is formed as a T-gate that fills the trench.

12. The e-mode FET of claim 1, wherein the conducting channels of the superlattice include two-dimensional electron gas (2DEG) channels.

13. The e-mode FET of claim 1, wherein the e-mode FET is constructed on a first portion of the superlattice of conducting channels that is adjacent to a second portion of the superlattice of conducting channels on which a depletion-mode (d-mode) FET is constructed.

14. The e-mode FET of claim 13, wherein the d-mode FET includes a superlattice castellated FET (SLCFET).

15. A method of forming an enhancement-mode (e-mode) field effect transistor (FET), comprising:
   forming a buffer layer;
   forming on the buffer layer a superlattice of conducting channels including a trench that cuts down through the superlattice into the buffer layer and separates the superlattice into a source-access region and a drain-access region of the superlattice, wherein the buffer layer forms a bottom of the trench, and wherein the superlattice does not include any ridges formed in the superlattice and does not include any trenches formed in the superlattice other than the trench;
   forming a source and a drain adjacent to the source-access region and the drain-access region, respectively, so that the source and the drain are each spaced-apart from the trench; and
   forming a gate in the trench, the gate configured such that (i) a voltage above a threshold voltage of the e-mode FET applied to the gate induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

16. The method of forming the e-mode FET of claim 15, wherein:
   the forming the superlattice includes forming the superlattice so that an edge of the source-access region and an edge of the drain-access region that are spaced-apart from each other across the trench form a source-side trench sidewall and a drain-side trench sidewall that rise from the bottom of the trench to a topside of the superlattice, respectively; and
   the forming the gate includes forming the gate fill the trench such that the gate has a source-side gate sidewall and a drain-side gate sidewall adjacent to the source-side trench sidewall and the drain-side trench sidewall, respectively, and a gate bottom adjacent the bottom of the trench, respectively.

17. The method of forming the e-mode FET of claim 16, wherein the forming the gate further includes forming the gate as a T-gate that fills the trench completely and covers a periphery of the edge of the source-access region and a periphery of the edge of the drain-access region on the topside of the superlattice.

18. An integrated circuit comprising:
   a buffer layer;
   a superlattice of conducting channels on the buffer layer;
   an e-mode field effect transistor (FET) constructed on a first portion of the superlattice; and
   a superlattice castellated FET (SLCFET) constructed on a second portion of the superlattice that is spaced-apart from the first portion of the superlattice;
   wherein, the e-mode FET includes:
      in the first portion of the superlattice, a trench that cuts down through the first portion of the superlattice into the buffer layer and that separates the first portion of the superlattice into a source-access region and a drain-access region of the first portion of the superlattice, wherein the buffer layer forms a bottom of the trench;
      a source and a drain adjacent to the source-access region and the drain-access region; and
      a gate disposed in the trench and configured such that (i) a voltage above a threshold voltage of the e-mode FET applied to the gate induces in the buffer layer underneath the gate a current channel, which electrically connects the source-access region to the drain-access region to turn on the e-mode FET, and (ii) a voltage below the threshold voltage applied to the gate eliminates the current channel, which electrically disconnects the source-access region from the drain-access region to turn off the e-mode FET.

19. The integrated circuit of claim 18, wherein the SLCFET includes:
   a source-access region and a drain-access region of the second portion of the superlattice that are spaced-apart from each other in a first direction;
   alternating multichannel ridges and trenches formed in the second portion of the superlattice that extend in parallel with each other in the first direction from the source-access region to the drain-access region, and that undulate in a second direction transverse to the first direction;
   a source and a drain on the source-access region and the drain-access region of the SLCFET, respectively; and
   a gate covering a portion of the multichannel ridges and trenches.

* * * * *